(12) United States Patent
Miyahara

(10) Patent No.: US 7,969,740 B2
(45) Date of Patent: Jun. 28, 2011

(54) METAL-BASED PRINT BOARD FORMED WITH RADIATORS

(75) Inventor: Hideyuki Miyahara, Nagano-ken (JP)

(73) Assignee: Nakamura Seisakusho Kabushikigaisha, Nagano-ken (JP)

( * ) Notice: Subject to any disclaimer, the term of this patent is extended or adjusted under 35 U.S.C. 154(b) by 0 days.

(21) Appl. No.: 12/720,739

(22) Filed: Mar. 10, 2010

(65) Prior Publication Data

US 2010/0202112 A1  Aug. 12, 2010

(30) Foreign Application Priority Data

Aug. 24, 2007  (JP) ................................ 2007-219101

(51) Int. Cl.
*H05K 7/20* (2006.01)
*B32B 15/00* (2006.01)

(52) U.S. Cl. ........ 361/704; 361/707; 361/748; 428/615; 257/706

(58) Field of Classification Search .......................... None
See application file for complete search history.

(56) References Cited

U.S. PATENT DOCUMENTS

| | | | |
|---|---|---|---|
| 5,316,831 A * | 5/1994 | Nakajima et al. | 428/209 |
| 6,396,699 B1 * | 5/2002 | Caldwell et al. | 361/704 |
| 6,541,126 B1 * | 4/2003 | Yoshioka et al. | 428/624 |
| 6,844,054 B2 * | 1/2005 | Whatley | 428/295.4 |
| 7,323,255 B2 * | 1/2008 | Tanaka et al. | 428/615 |
| 7,632,712 B2 * | 12/2009 | Kroener | 438/110 |
| 7,906,219 B2 * | 3/2011 | Ohara et al. | 428/615 |
| 2008/0160246 A1 * | 7/2008 | Buhler et al. | 428/99 |

FOREIGN PATENT DOCUMENTS

| | | |
|---|---|---|
| JP | 06-152080 A | 5/1994 |
| JP | 06-188572 A | 7/1994 |
| JP | 2005-093582 A | 4/2005 |

* cited by examiner

*Primary Examiner* — Boris L Chervinsky
(74) *Attorney, Agent, or Firm* — Ditthavong Mori & Steiner, P.C.

(57) ABSTRACT

In a metal-based print board formed with radiators, a metal foil is affixed to a front surface of a metal plate having good thermal conductivity, an insulating adhesive layer interposed therebetween. A radiator is integrally provided on a reverse surface of the metal plate, the radiator having a plurality of thin radiating fins formed upright in a tabular shape due to having been dug out by an excavating tool. The radiating fins give the radiator a large area over which heat can be released. The thickness of a first metal plate portion formed between adjacent radiating fins is less than the original thickness of the metal plate. Heat generated by an electronic component or another component provided on a side of the front surface of the metal plate is rapidly transmitted from the reduced-thickness first metal plate portion of the metal plate to each of the radiating fins of the radiator on the reverse surface side, and efficiently released from each of the radiating fins, which have a large area over which heat is radiated.

8 Claims, 10 Drawing Sheets

METAL-BASED PRINT BOARD FORMED WITH RADIATORS

TECHNICAL FIELD

The present invention relates to a metal-based print board used in the field of electronic devices, and specifically to a metal-based print board integrally provided with a radiator for radiating heat generated by an electronic or another component.

BACKGROUND ART

Over the past several years, the demand for electronic devices to exhibit higher levels of performance while being made smaller in size has seen a reduction in circuit component size, an increase in density, improvements in functionality, and higher circuit component mounting densities on circuit boards. As a result, there has been an increase in the temperature of the circuit components during operation, and allowing heat to dissipate has become an issue of significant importance. Various methods have been proposed in the past as means for allowing heat to radiate, and some of these methods have already been implemented.

In JP-A-2005-93582 (patent reference 1), there is disclosed a configuration for providing a radiation board having a two-layered structure comprising a metal plate and an insulating layer, whereby heat generated by circuit components is released via the radiation board. In JP-A-06-188572 (patent reference 2), there is proposed a printed circuit board with a metal core, where a continuous hollow portion is formed in the metal core to allow exposure via a side surface of the board. The hollow portion increases the size of the area through which heat radiation occurs, and makes it possible to obtain a high heat-dissipating capacity. In JP-A-06-152080 (patent reference 3), there is disclosed a configuration wherein a heat-radiating copper block that also functions as a conducting body for mounting components is attached on a portion of an upper surface of an insulating plate and a mounting portion is formed; components that generate a high amount of heat are mounted on the mounting portion; and heat is allowed to be released.

For instances when heat must be released from circuit components, there has been adopted a method for using a printed substrate having a metallic base on which a copper foil or another metallic foil is affixed with an insulating adhesive layer interposed therebetween. The printed substrate has a plate made of copper, iron, an iron-nickel alloy, aluminum, or another metal with good thermal conductivity as a base material.

However, according to the radiating means disclosed in patent reference 1, the radiation board has a small area over which heat is radiated; therefore, the radiation efficiency is low, and the amount of heat radiated is often insufficient. The means also has a complex structure, and requires the radiation board to be manufactured as a separate component to be brought into contact with a top surface of each of the circuit components with a great degree of accuracy; therefore, problems are also presented in terms of increasing component and assembly costs.

According to the radiating means disclosed in patent reference 2, there exists a limit to the number of hollow sections provided in the metal core, and the area over which heat is radiated cannot be increased; therefore, the radiation efficiency is low and the amount of heat radiated is often insufficient. There is also a need to configure the print circuit board with the metal core so that there are two or more layers; therefore, problems are also presented in terms of increasing component and manufacturing costs.

According to the radiating means disclosed in patent reference 3, the radiating copper block is covered by components mounted on its upper surface, and its other surfaces are enclosed by a second insulating board. Therefore, problems are presented in that the radiating copper block substantially lacks a surface through which heat can be radiated, and insufficient heat is radiated. Also, there is a need to manufacture the radiating copper block as a separate component, and to form a mounting portion for mounting components on its upper surface, presenting problems of increasing component and manufacturing costs.

Also, according to the radiating means using a metal-based print board, heat generated by the circuit components is released via the metal base. Again, there is a limit to the area over which heat can be released, and there may be instances where the amount of heat radiated is smaller than desired. Therefore, the need arises to use the means alongside other radiating means, and inevitably the cost ultimately increases.

SUMMARY OF THE INVENTION

A main object of the present invention is to provide a metal-based print board formed with radiators, wherein a radiator is integrally provided to a metal-based print board to increase the area through which heat is radiated, and heat generated by an electronic or another component can be efficiently radiated through radiating fins on the radiator.

In order to attain the above and other objects, a metal-based print board formed with radiators according to the present invention comprises:

a thermally conductive metal plate having a prescribed plate thickness;

a metallic foil affixed to a first surface of the metal plate with an adhesive layer interposed therebetween; and a radiator integrally formed on a second surface of the metal plate that is on an opposite side of the first surface, wherein the radiator has a plurality of tabular radiating fins, formed upright on the second surface of the metal plate at prescribed intervals by using an excavating tool to dig into the second surface;

each of the radiating fins gradually decreases in thickness from a proximal portion connected to the second surface towards a distal end, and curves from the proximal portion to the distal end;

a spacing between adjacent radiating fins gradually increases from the proximal portion towards the distal end; and the metal plate is configured so that a thickness is smaller in a first metal plate portion between each of the radiating fins of the radiator than a second metal plate portion of the metal plate excluding the radiator.

According to the metal-based print board of the present invention, heat generated by an electronic component attached to a wiring pattern formed by the metallic foil can be directly transmitted from the metal plate to the radiator and released. The radiator has a plurality of radiating fins and therefore has a large area through which heat is radiated. Therefore, the radiator has a high radiation efficiency, and can efficiently cool the electronic component. Also, the thickness of each portion of the metal plate between adjacent radiating fins (i.e., the first metal plate portion) on the radiator is small. Therefore, heat generated by the electronic component is transmitted to the radiator in a short space of time, making it possible to further increase the radiation efficiency. Also, since the radiator is integrally formed on the metal plate forming the print board, the configuration is made simple, and it becomes possible to reduce component and manufacturing costs.

Also, each of the radiating fins is made to gradually become thinner from the proximal portion to the distal end. As a result, the proximal portion of each of the radiating fins has a large thickness, and therefore has a large heat capacity and can readily acquire the heat from the metal plate. The heat is transmitted towards the distal end portion of the radiating fin while being gradually released to the exterior; therefore, only a small amount of heat is transmitted to the thin distal end with a small heat capacity. The radiating fins can accordingly transmit and release heat efficiently as a whole. Also, since the spacing between each of the radiating fins gradually increases from the proximal portion towards the distal end of each of the radiating fins, heat radiated in the vicinity of the proximal portion can be readily released in the direction of the distal end portion. Also, since each of the radiating fins is shaped so as to curve from the proximal portion to the distal end portion, the area of each of the radiating fins over which radiation occurs can be expanded while any increase in height of the radiating fins can be minimized. Therefore, the radiation efficiency of the radiator can be increased while any increase in the thickness of the metal-based print board can be minimized.

The radiator is preferably surrounded by the second metal plate portion. Heat generated by an electronic component provided on the side of the first surface of the metal plate is efficiently transmitted to the radiator on the reverse side via the first metal plate portion having a reduced thickness; therefore, the radiation efficiency can be increased. Also, since the radiator is surrounded by the second metal plate portion having a greater thickness, the radiator having a reduced thickness and a lower mechanical strength is mechanically reinforced, and deformation of the radiator, or a similar problem, can be prevented.

Also, in an instance where the heat-generating electronic component is provided in a plurality of positions, it is preferable that a radiator be formed at a position corresponding to each of the electronic component positions. In such an instance, it is again preferable that each of the radiators be surrounded by the second metal plate portion, whereby mechanical reinforcement is provided.

In an instance where a radiator is provided in a plurality of positions, a third metal plate portion having a thickness less than that of the second metal plate portion, e.g., a third metal plate portion having a thickness equal to that of the first metal plate portion, may be formed between adjacent radiators if, for example, the radiator does not deform, or no problems are otherwise presented. Such a configuration makes it possible to efficiently transmit heat from the side of the first surface of the metal plate to the second surface on the side of the radiator via the third metal plate portion having a small thickness, and efficiently release heat via the radiator.

In such an instance, the third metal plate portion may be formed from one end to the other end of the metal plate, and fashioned to a thickness allowing bending or curving. According to such a configuration, the third metal plate portion can be bent or curved, thereby disposing the metal plate-based print board in a bent or curved state within an electronic device. Each component within the electronic device can thereby be laid out with a greater degree of latitude, as can the metal plate-based print board.

Next, the radiator may be formed at a position that faces the mounting position relating to the heat-generating electronic component whose heat is to be released on the surface of the metallic foil.

In an instance where a plurality of mounting positions, relating to each of which a heat-generating electronic component whose heat is to be released, are defined on the surface of the metallic foil, a radiator may be formed on each portion on the second surface of the metal plate that faces each of the mounting positions.

DETAILED DESCRIPTION OF THE PREFERRED EMBODIMENTS

Embodiments of a metal-based print board formed with radiators according to the present invention will now be described in detail with reference to the drawings.

Embodiment 1

Figure 1:
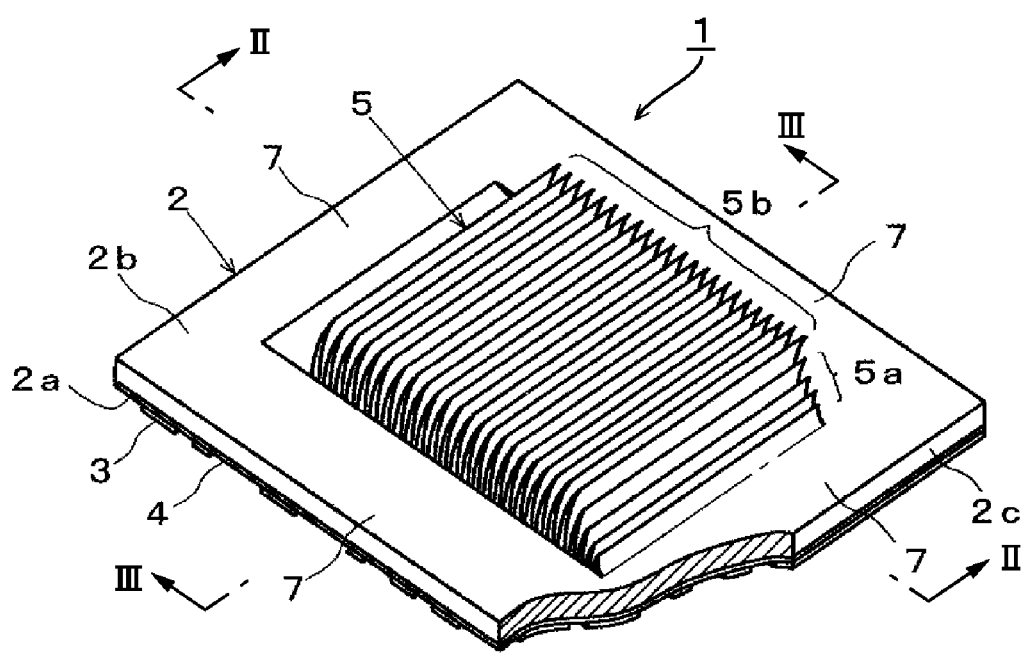
FIG. 1 is a perspective view showing a reverse surface side of a metal-based print board formed with radiators according to a first embodiment of the present invention.
Figure 2A:
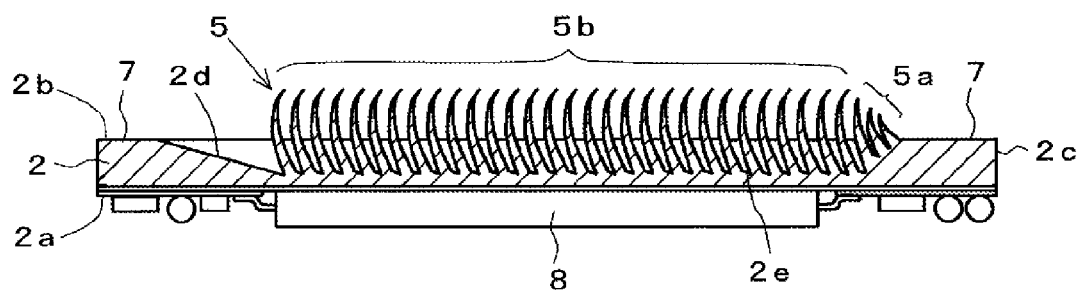
FIG. 2A is a sectional view of a portion taken along line II-II in FIG. 1.
Figure 2B:
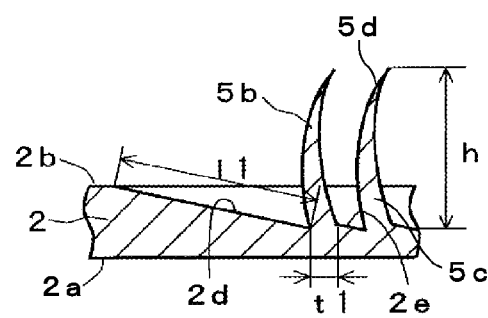
FIG. 2B is a partial enlarged cross-sectional view showing radiating fins.
Figure 3:
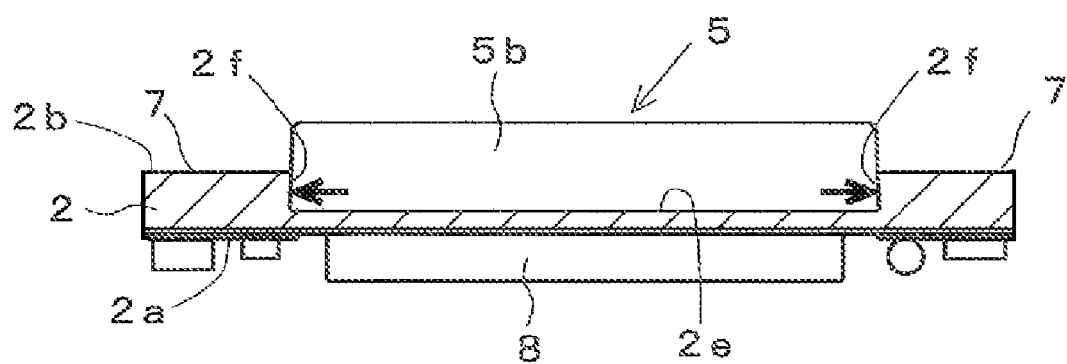
FIG. 3 is a sectional view of a portion taken along line in FIG. 1.

FIG. 1 is a perspective view showing a reverse surface side of a metal-based print board formed with radiators according to a first embodiment of the present invention. FIGS. 2A and 2B are respectively a sectional view and a partial enlarged cross-sectional view of a portion taken along line II-II in FIG. 1, and FIG. 3 is a sectional view of a portion taken along line in FIG. 1. A metal-based print board 1 shown in the drawings has a metal plate 2 made of copper, iron, an iron-nickel alloy, aluminum, aluminum whose surface has been subjected to alumite treatment, or another metal with good thermal conductivity as a base material. A copper foil or another metallic foil 3 is affixed to a front surface 2a (first surface) of the metal plate 2 with an insulating adhesive layer 4, made of an insulating adhesive, interposed therebetween. The insulating adhesive layer 4 has, for example, a high-heat-resistance epoxy resin or another thermosetting resin as a base resin. A fine particulate inorganic filler is preferably added to obtain higher radiating performance. The metallic foil 3 is chemically etched in a known manner, whereby a prescribed wiring pattern is formed. Also, depending on requirements, the metallic foil 3 is coated with a resist made of an electrically insulating film except where lands are located on the wiring pattern.

A reverse surface 2b (second surface) on the opposite side of the metal plate 2 has, at a position inward relative to an end surface 2c, an integrally formed radiator 5. The radiator 5 has a plurality of small fins 5a and a plurality of thin, tabular radiating fins 5b of uniform height formed in continuation therefrom. The small fins 5a are formed so that the height of each of them progressively increases from the end surface 2c of the metal plate 2 towards the side facing the radiating fins 5b. A proximal portion 5c of each of the small fins 5a and radiating fins 5b connects to the reverse surface 2b of the metal plate 2 as shown in FIGS. 2A and 2B. A distal end side of each of the radiating fins 5b is moderately curved. The radiating fins 5b are formed at identical angles, and are formed upright at regular intervals. As can be seen in FIG. 2B, the plurality of radiating fins 5b of the radiator 5 are configured so that each of the fins is thicker at the proximal portion 5c connected to the metal plate 2, and gradually becomes thinner towards a distal end portion 5d of each of the fins.

The small fins 5a and the radiating fins 5b are formed by excavating the reverse surface 2b of the metal plate 2 using an excavating tool, and can therefore be made thinner. The radiating fins 5b are preferably about 0.03 mm to 1.0 mm thick in, e.g., a radiator 5 used for a small electronic component. The spacing between each of the radiating fins 5b is set as desired at a distance of 0.01 mm or greater. The thickness of a bottom surface 2e formed between adjacent radiating fins 5b (i.e., the thickness of the first metal plate portion) is less than the thickness of the metal plate 2 (i.e., the thickness of the second metal plate section) by the depth to which the radiating fins are dug out. The radiating fins 5b may be formed so that each of them has a different thickness or spacing therebetween. When the radiating fins 5b are formed so that the thickness is greater at the proximal portion 5c and decreases towards the distal end 5d, the thickness of the base end portion 5c results in a large heat capacity, allowing heat to be readily acquired from the metal plate 2. Also, the heat is gradually released as it is transmitted towards the distal end portion 5d, allowing heat to be readily released even though the heat capacity of the distal end portion 5d is small. Since the radiating fins 5b have a thickness that changes to suit the transmission and radiation of heat as described above, it is possible to obtain a radiator 5 having a high radiation efficiency.

Next, a method for manufacturing the radiator 5 of the metal-based print board 1 shown in FIGS. 1 through 3 will be described with reference to FIGS. 8A through 8F. The metal plate 2 is preferably made of copper or aluminum since these metals have good thermal conductivity and are readily cut. The metal plate 2 preferably has a thickness of between 0.5 mm and several millimeters, as used in regular electronic circuits. A copper foil or another metallic foil 3 is affixed to a surface 2a of the metal plate 2 with an insulating adhesive layer 4 interposed therebetween. The metallic foil 3 is etched to form a prescribed wiring pattern, and is configured as a metal-based print board. No electronic components are mounted before the radiator 5 has been manufactured. The metal plate 2 is placed on a press device (not shown), whereupon the small fins 5a and the radiating fins 5b are caused to project upright using an excavating tool 6.

Figure 8A:
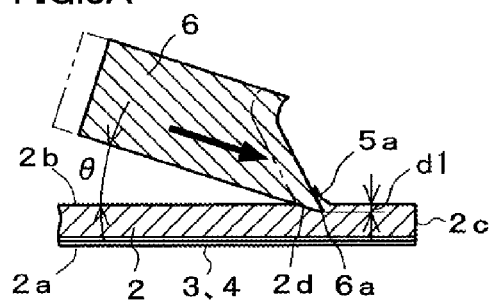
FIGS. 8A through 8F are drawings showing steps for forming the radiator according to the present invention.
Figure 8D:
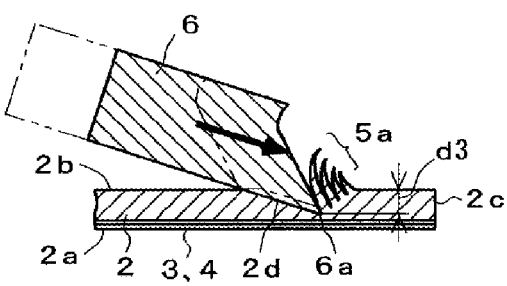
Figure 8B:
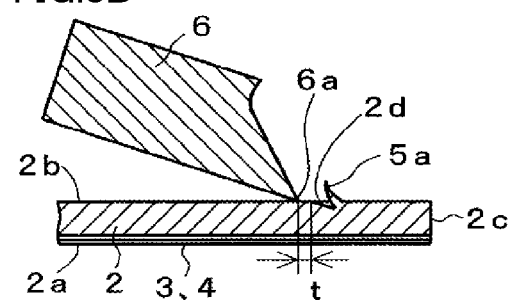
Figure 8E:
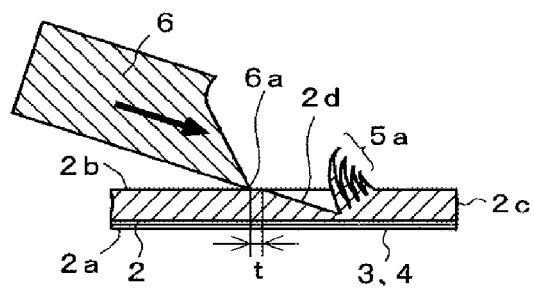
Figure 8C:
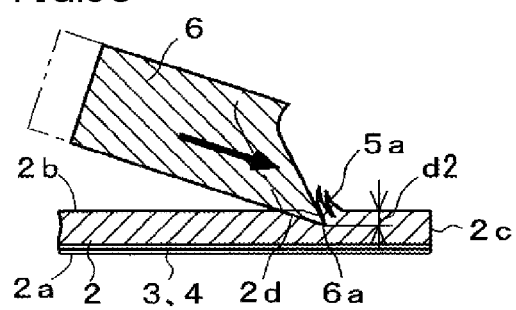

The excavating tool 6 has, at a distal end of the bottom surface side, a blade section 6a formed perpendicular to the direction of movement. The width of the excavating tool 6 is set as a required width for the radiator 5. Also, the excavating tool 6 is attached to a driving device (not shown) so as to be inclined at a prescribed angle θ whereby a rear end side is higher than a surface of the metal plate 2. The incline angle θ is set as appropriate according to the height or thickness of the radiating fin 5b or the material constituting the metal plate 2, and is generally set to 5° to 20°. While both sides in the lateral direction of the which is greater than the depth when the first small fin 5a was formed, thereby forming upright a second small fin 5a having a greater height than the first small fin 5a, as shown in FIG. 8C. Repeatedly thereafter, the excavating tool 6 is moved from a position further upstream of the machined surface 2d formed by causing the small fin 5a to project upright, where an excavation clearance t can be obtained; and the excavating tool 6 is caused to dig in to a greater depth than the depth by which it was dug in when the preceding small fin 5a was formed upright, thereby causing a small fin 5a having an even greater height to project upright. The step for forming the small fins 5a as described above is ended when the blade section 6a reaches a prescribed depth d3 as shown in FIG. 8D.

As a result of forming the first small fin 5a at a prescribed position on the surface on one side set at a distance from an end side 2c of the metal plate 2, then successively forming a plurality of small fins 5a while successively changing the depth by which the excavating tool 6 is dug in, as described above, the height of the small fins 5a gradually increases, and top portions of the small fins 5a form an imaginary slope.

After the small fins 5a are formed upright, the process then leads to a fin-forming step for forming radiating fins 5b of fixed height. Specifically, the blade section 6a of the excavating tool 6 is moved from a position where an excavation clearance t can be obtained further upstream of the machined surface 2d formed by the most recently formed small fin 5a, until the prescribed depth d3 is reached, as shown in FIG. 8E. The radiating fin 5b is thereby formed at a prescribed height. Next, an excavation step is repeatedly performed.

Figure 8F:
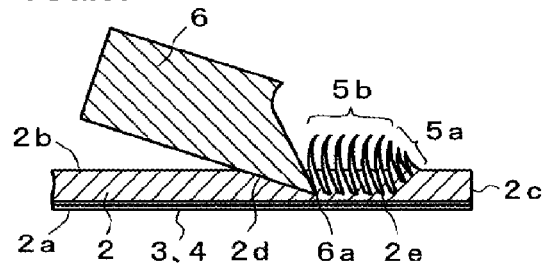

In the excavation step, the excavating tool 6 is moved to a position upstream of the machined surface 2d and moved until the prescribed depth d3 is reached; and the radiating fins 5b are thereby formed upright at a uniform angle and at uniform intervals, as shown in FIG. 8F. The formation of the radiating fins 5b thereby forms a concave portion 2e (i.e., the first metal plate portion) that is thinner than the metal plate 2, the concave portion 2e being formed between adjacent radiating fins 5b as shown in FIGS. 2 and 3. A metal plate portion that surrounds the concave portion 2e is a metal plate portion (i.e., the second metal plate portion) in which the original, fixed thickness is preserved. Accordingly, an inner wall 2f is formed so as to surround the concave portion 2e.

In the fin-forming step, when the excavating tool 6 is used to form the radiating fin 5b upright on the metal plate 2, the radiating fin 5b is formed to be thicker on a proximal side and gradually thinner towards a distal end, as shown in FIG. 2B. Also, the proximal side of the radiating fin 5b is not only thicker, but also bulges in both lateral directions as indicated by arrows in FIG. 3. As a result, the proximal side of the radiating fins 5b is joined under compressive contact to the inner wall 2f. As a result, even when the radiating fin 5b is formed so as to have a small thickness of about 0.05 mm, the proximal portion is held to the metal plate 2, and a large mechanical strength can therefore be obtained. Also, both sides of the vicinity of the proximal end of the radiating fin 5b are thermally connected to the metal plate 2, and the radiation efficiency can therefore be increased.

Meanwhile, an inclined machined surface 2d, extending from a bottom surface of a concave portion 2e to a surface of the metal plate 2, is left upstream of the radiating fin 5b located on the side opposite to that of the small fins 5a as shown in FIG. 2. The inclined machined surface 2d can function as a radiating surface. A flange portion 7 having the thickness of the metal plate 2 is formed behind the machined surface 2d.

A flange portion 7 (i.e., the second metal plate portion) which retains the original uniform thickness of the metal plate 2 is formed on either side of the radiating fins 5b formed on the metal plate 2. The flange portion 7 can be formed by the excavating tool 6 smaller in width than the metal plate 2. As a result, the flange portion 7 formed on a radiating device 1 is formed so as to surround the radiator 5, as shown in FIG. 1.

The radiator 5 is formed at a position corresponding to the position of an integrated circuit 8, for example, or another electronic component mounted on a wiring pattern formed by the metallic foil 3 on the front surface 2a of the metal plate 2. Having the radiator 5 provided according to a positional relationship of such description allow heat generated by the integrated circuit 8 to be transmitted to the radiator 5 via the metal plate 2 and released into the air from a surface of the radiating fin 5b. The integrated circuit 8 is concentrated at a central portion of the radiator 5; therefore, the small height of the small fins 5a does not affect radiating performance. Also, experimentation has revealed that the existence of a machined surface 2d remaining on the upstream side of the radiator 5 does not affect radiating performance. Experimentation has also revealed that, since the proximal end of each of the small fins 5a and the radiating fins 5b is integrally connected to the concave portion 2e formed on a surface of the metal plate 2, and the metal plate 2 is of reduced thickness between the concave portion 2e and a first surface 2a, the heat generated by the integrated circuit 8 rapidly reaches the radiator 5, and the radiation efficiency therefore increases. Other than the integrated circuit 8, the electronic component may be a power transistor, a resistor, a power module, or a similar component.

First Modification of the First Embodiment

Figure 4:
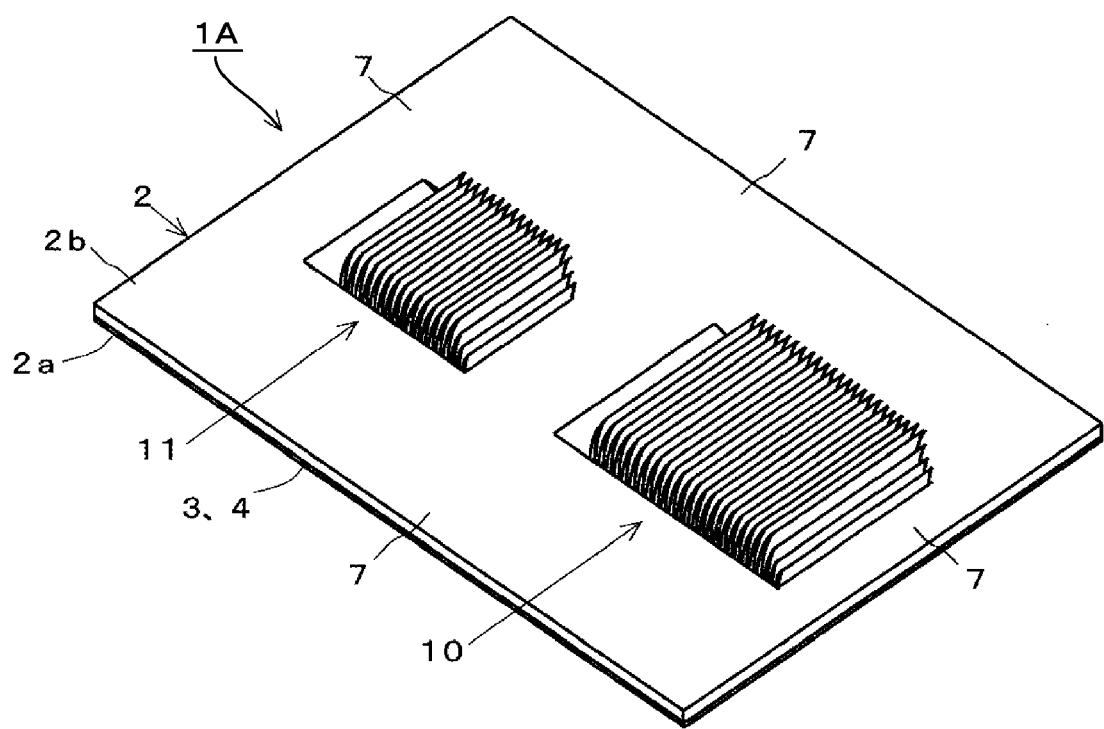
FIG. 4 is a perspective view showing a modification of the metal-based print board formed with radiators shown in FIG. 1.

FIG. 4 is a perspective view showing a modification of the metal-based print board formed with radiators shown in FIG. 1. Two radiators 10, 11 are provided so as to be set apart from one another on the reverse surface 2b of the metal plate 2 of a metal-based print board 1A having radiators. The second radiator 11 is smaller than the first radiator 10. The radiators are provided so as to be set apart from one another and are surrounded by a flange portion 7 (i.e., the second metal plate portion) where the metal plate 2 retains the original thickness. An integrated circuit or another heat-generating electronic component (not shown) is mounted on each portion (i.e., mounting position) on the front surface 2a of the metal plate 2 that corresponds with the first and second radiators 10, 11 respectively.

When a plurality of electronic components that require cooling are mounted on a single metal-based print board 1A as described above, a radiator may be provided to each portion on the reverse surface 2b of the metal plate 2 that corresponds with each of the electronic components. Also, in an instance where each of the electronic components varies in terms of size and the amount of heat generated, it is preferable that the size of the radiator be varied as shown in FIG. 4. The first and second radiators 10, 11 that differ in size are formed on the reverse surface 2b of the metal plate 2 using an excavating tool that matches the width of each of the radiators according to the method shown in FIGS. 8A through 8F. The length of the radiator can be varied and set as required by varying the number of radiating fins.

Second Modification of the First Embodiment

Figure 5A:
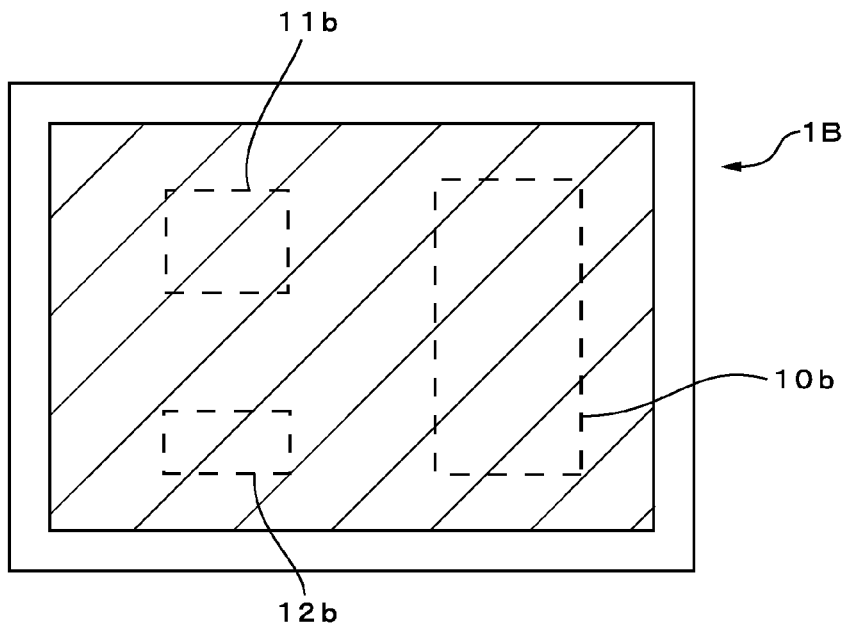
FIGS. 5A, 5B, and 5C are, respectively, a top view, reverse view, and cross-sectional view of another modification of the metal-based print board formed with radiators shown in FIG. 1.
Figure 5B:
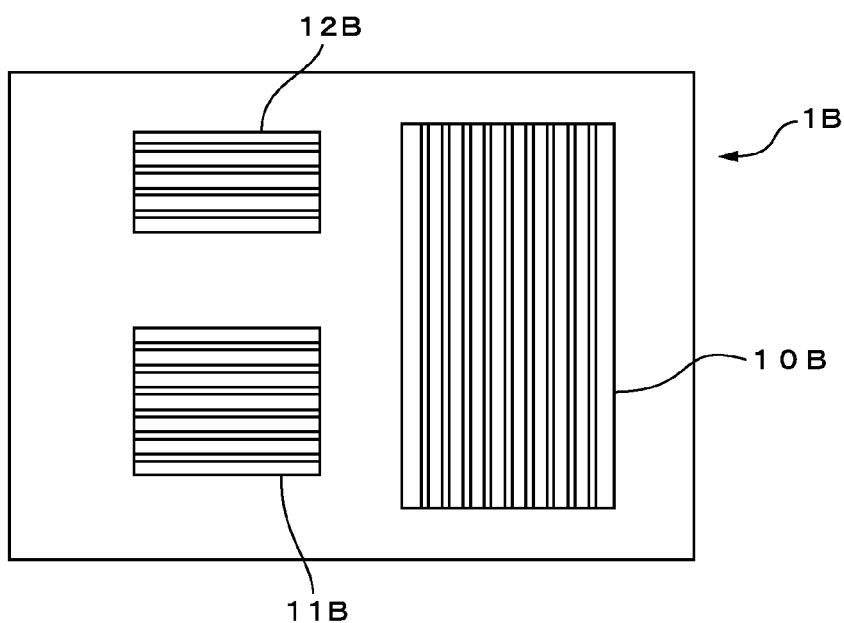
Figure 5C:
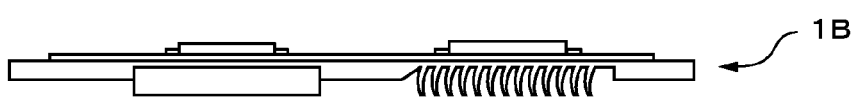

FIGS. 5A, 5B, and 5C are, respectively, a top view, reverse view, and cross-sectional view of a second modification of the metal-based print board formed with radiators shown in FIG. 1. Radiators 10B, 11B, 12B of varying size are formed on the reverse surface 2b of a metal plate 2B of a metal-based print board 1B having a radiator. The radiator 10B comprises radiating fins extending in the short-side direction of the metal plate 2B, and the radiators 11B, 12B comprise radiating fins extending in the long-side direction of the metal plate 2B. As shall be apparent, the radiating fins of the radiators may also be aligned in a uniform direction. A wiring pattern is formed on a metallic foil 3 on a front surface side of the metal-based print board 1B with radiators. Three mounting positions 10b, 11b, 12b for mounting heat-generating electronic components are specified on the wiring pattern, as indicated by dotted lines. The radiators 10B, 11B, 12B are each provided on a portion on a reverse surface of the metal plate that corresponds with each of the respective mounting positions.

Each of the metal-based print boards 1, 1A, 1B has an integrated circuit, resistor, capacitor or another electronic component, or a chip mounter or a similar device for holding a chip for an electronic component, mounted on the wiring pattern provided on the front surface 2a. The surface 2a of the metal-based print board 1 is then subjected to reflow soldering, thereby establishing an electrical connection between the chip for the electrical component and the wiring pattern.

Second Embodiment

Figure 6:
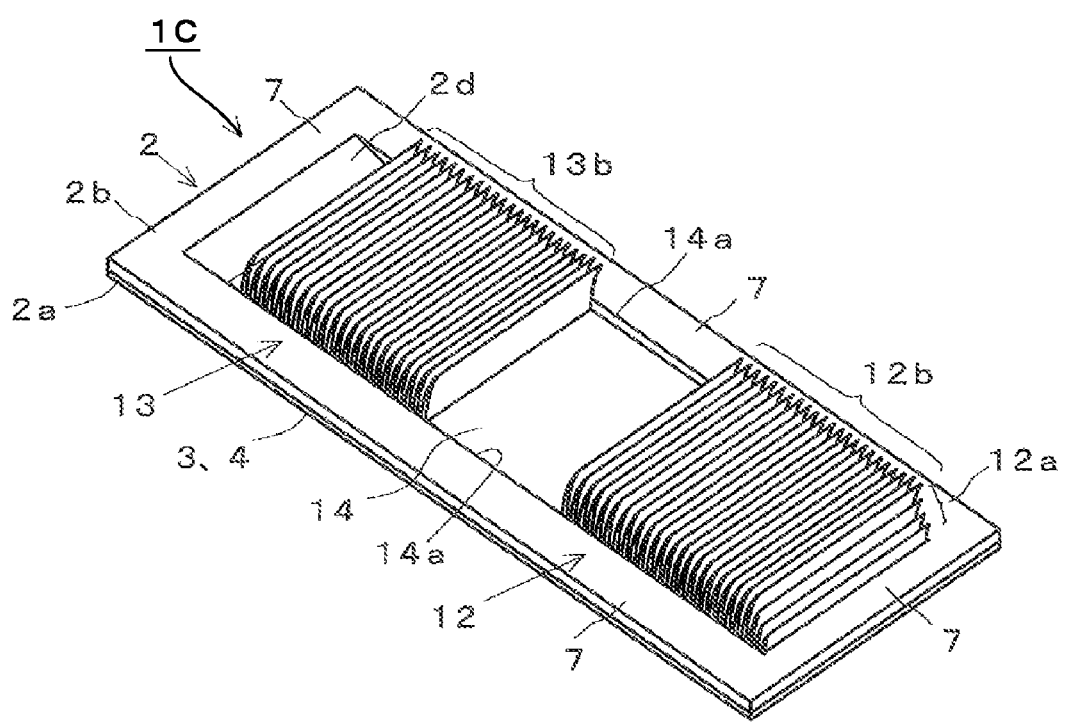
FIG. 6 is a perspective view showing a reverse surface side of a metal-based print board formed with radiators according to a second embodiment of the present invention.

FIG. 6 is a view showing a metal-based print board formed with radiators according to a second embodiment of the present invention; and is a perspective view showing a reverse surface side of the board. Two radiators 12, 13 are provided so as to be set apart from one another on the reverse surface 2b of a metal plate 2 of a metal-based print board 1C with radiators. A concave portion 14 (i.e., the third metal plate portion) that is thinner than that of the metal plate 2 is provided between the radiators 12, 13. An integrated circuit or another heat-generating electronic component (not shown) is mounted on each portion of a front surface 2a of the metal plate 2 corresponding to each of the first and second radiators 12, 13. A flange portion 7 (i.e., second metal plate portion), which retains the original thickness of the metal plate, is retained on an outer rim portion of the metal plate 2 that surrounds the two radiators 12, 13 and the concave portion 14.

FIGS. 9A through 9G are drawings showing a method for forming the radiators 12, 13 and the concave portion 14 therebetween on the metal plate 2 according to the present invention. First, the first radiator 12 is formed from a position on a reverse surface 2b of the metal plate 2 set at a distance from an end portion 2c. A method for forming the first radiator 12 is similar to the method shown using FIGS. 8A through 8F, and a description shall be omitted here.

Figure 9A:
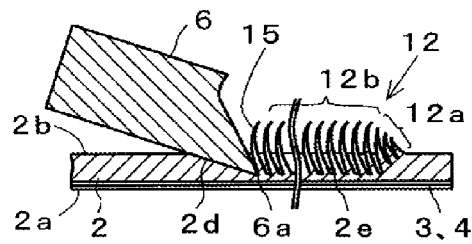
FIGS. 9A through 9G are drawings showing steps for forming a concave portion between radiators according to the present invention.
Figure 9E:
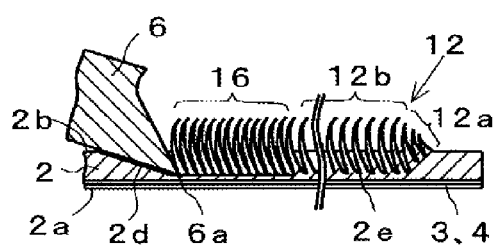
Figure 9B:
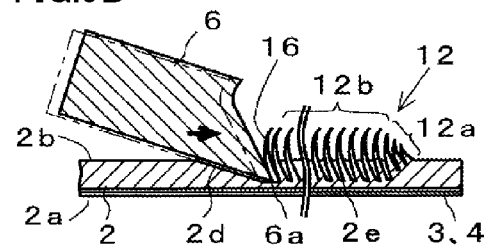

After the first radiator 12 is formed on the reverse surface 2b of the metal plate 2, a concave portion 14 is formed following on from the first radiator 12. As shown in FIG. 9A, an excavating tool 6 is used to form a cut fin 15 upright from a position at which an excavation clearance can be obtained further upstream of a machined surface 2d formed by the most recently formed radiating fin 12b. The cut fins 15 are formed using a method similar to that for forming the radiating fins 5b described using FIG. 8. The process subsequently leads to a cutting step. As shown in FIG. 9B, the excavating tool 6 is moved in a horizontal direction parallel to a bottom surface of the subsequently formed concave portion 14. The horizontal movement of the excavating tool 6 cuts a proximal end of the cut fin 15, producing scrap 16. The scrap 16 that is separated from the metal plate 2 is sandwiched between inner walls 14a of the concave portion 14, and is thereby prevented from scattering, as described further below. The initial concave portion 14 having a width substantially equal to the proximal end of the cut fin 15 is thereby formed on the surface on the one side of the metal plate 2.

Figure 9F:
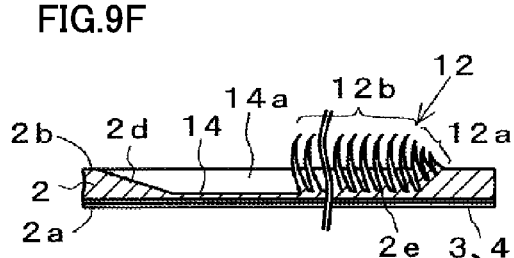
Figure 9C:
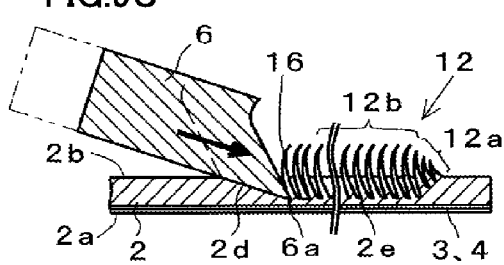
Figure 9G:
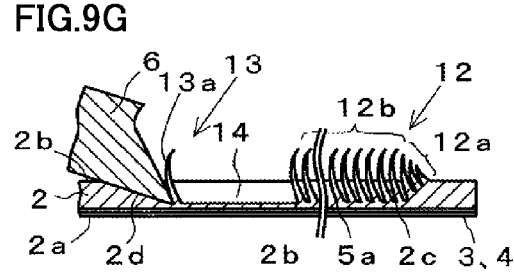
Figure 9D:
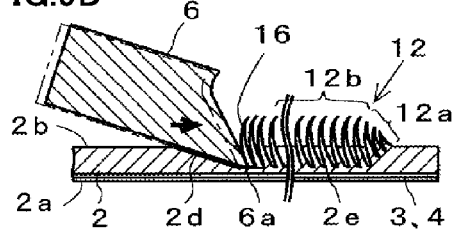

Next, a blade section 6a of the excavating tool 6 is brought into contact with the metal plate 2 further upstream, and a second cut fin 15 is formed, again using a method similar to that for forming the radiating fins 5b as previously described, as shown in FIG. 9C. The process subsequently leads to a cutting step, and the excavating tool 6 is moved in a horizontal direction and a proximal end of the second cut fin 15 is cut as shown in FIG. 9D. Again, the scrap 16 that is separated from the metal plate 2 as a result of the cutting of the cut fin 15 is sandwiched between the inner walls 14a on either side of the concave portion 14. A second concave portion 14 having a width substantially equal to that of the proximal end of the cut fin 15 is thereby formed on the surface on the one side of the metal plate 2 in continuation from the initial concave portion 14.

Repeatedly thereafter, the fin-forming step and the subsequent cutting step are performed. In the fin-forming step, the blade section 6a of the excavating tool 6 is brought into contact with the metal plate 2 on the upstream side and moved in the direction of excavation, and the next cut fin 15 is formed upright. In the subsequent cutting step, the excavating tool 6 is moved in the horizontal direction and the cut fin 15 is cut, thereby separating the scrap 16 from the metal plate 2. With the fin-forming step and the cutting step having been repeated in succession as described above, a plurality of scraps 16 are thereby sandwiched between the inner walls 14a of the concave portion 14, as shown in FIG. 9E. The scraps 16 are collectively removed using appropriate means, and the concave portion 14 having a width equal to that of the blade section 6a of the excavating tool 6, and having a desired length, is thereby formed as shown in FIG. 9F.

Next, a second radiator 13 having a plurality of radiating fins 5b formed upright is provided on the reverse surface 2b of the metal plate 2. As shown in FIG. 9G, a machined surface 2d remains on a rear end side of the concave portion 14. A radiating fin 13b of the second radiator 13 is formed using an excavating tool 6 from a position upstream of the machined surface 2d where an excavating clearance can be obtained. Next, the excavation step is repeatedly performed as previously described. In the excavation step, the excavating tool 6 is moved to a position upstream of the machined surface 2d, and moved until a prescribed depth is reached. A plurality of radiating fins 13b are thereby formed upright at a uniform angle and at uniform intervals; and the second radiator 13 is thereby provided.

Forming the concave portion 14 as described above thereby decreases the thickness of the metal plate portion defining a bottom surface of the concave portion 14 (i.e., the third metal plate portion). Therefore, the mechanical strength of the portion of the concave portion 14 decreases. However, a flange portion 17 (i.e., the second metal plate portion), where the metal plate 2 retains the original thickness, is formed on an outer rim side of the metal plate 2 serving to surround the two radiators 12, 13 and the concave portion 14. The flange portion 17 reinforces the concave portion 14, which is of reduced thickness. Therefore, adequate strength is maintained in the metal-based print board 1C as a whole. Also, the concave portion 14 is formed so that the plate thickness at the concave portion 14 is smaller than that of the metal plate 2; therefore, heat generated by an electronic component mounted on the side of the front surface 2a of the metal plate 2 is rapidly transmitted to the surface on the one side and to the radiators 12, 13. The concave portion 14 therefore has an effect of increasing the radiation efficiency.

Figure 10:
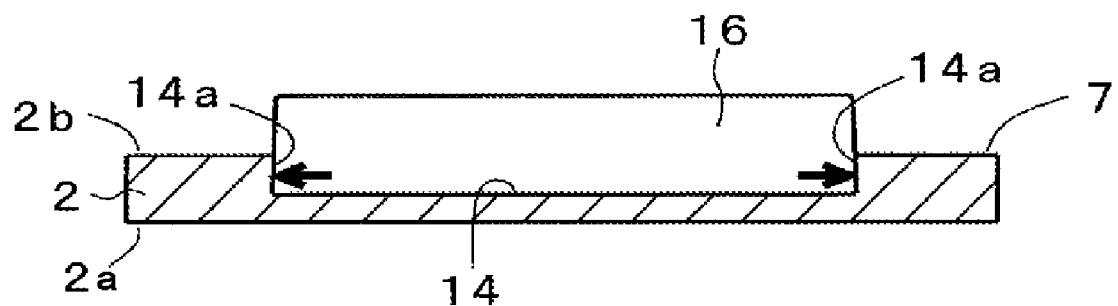
FIG. 10 is a cross-sectional view showing a state in which a scrap is held in the concave portion.

FIG. 10 is a view showing a state in which the scrap 16 is held by being sandwiched between the inner walls 14a of the concave portion 14. If the blade section 6a of the excavating tool 6 is formed in advance of the fin-forming step so as to be moderately blunt, then when the cut fin 15 is formed upright, the cutting resistance met by the blade section 6a causes the cut fin 15 to be formed to a greater thickness t1 at the proximal side and gradually reduced thickness towards the distal end, as shown in FIG. 9. Therefore, the height h of the cut fin 15 is shorter than the length 11 of the machined surface 2d. Also, the cut fin 15 bulges in both lateral directions as indicated by arrows in FIG. 10. As a result, the scrap 16 formed by cutting the proximal end of the cut fin 15 is sandwiched and held between the inner walls 14a of the concave portion 14. The scrap 16 is kept in the above-mentioned state of being sandwiched between the inner walls 14a of the concave portion 14, and is therefore prevented from scattering.

Modification of the Second Embodiment

Figure 7A:
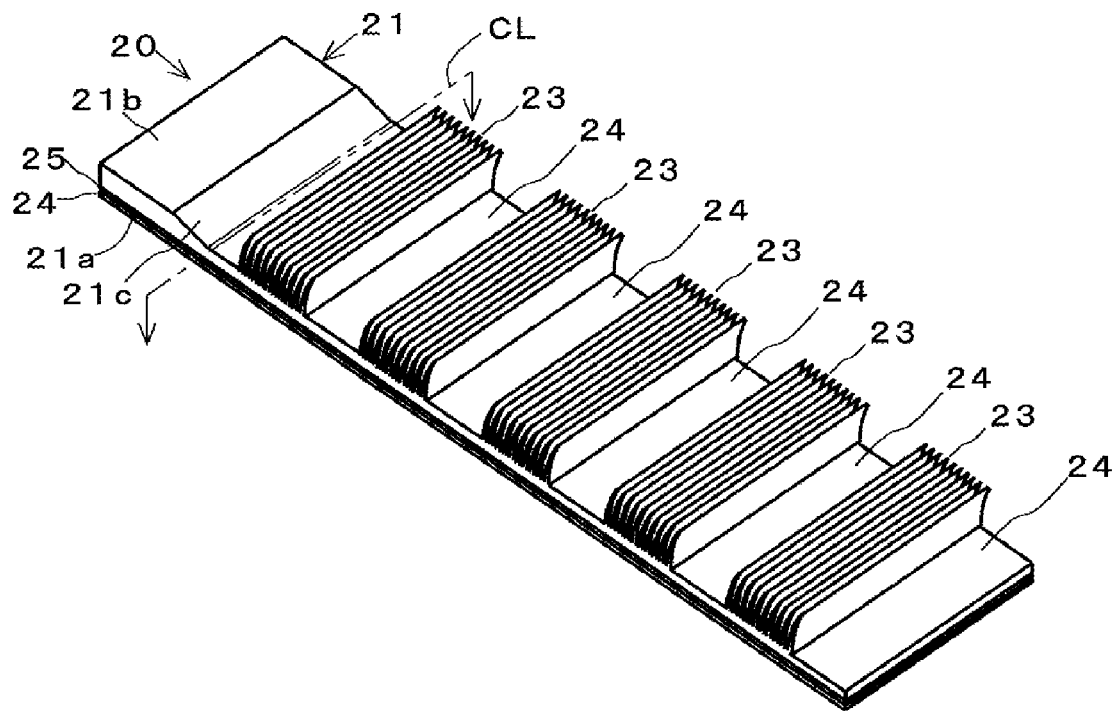
FIG. 7A is a perspective view showing a modification of the metal-based print board formed with radiators shown in FIG. 6.
Figure 7B:
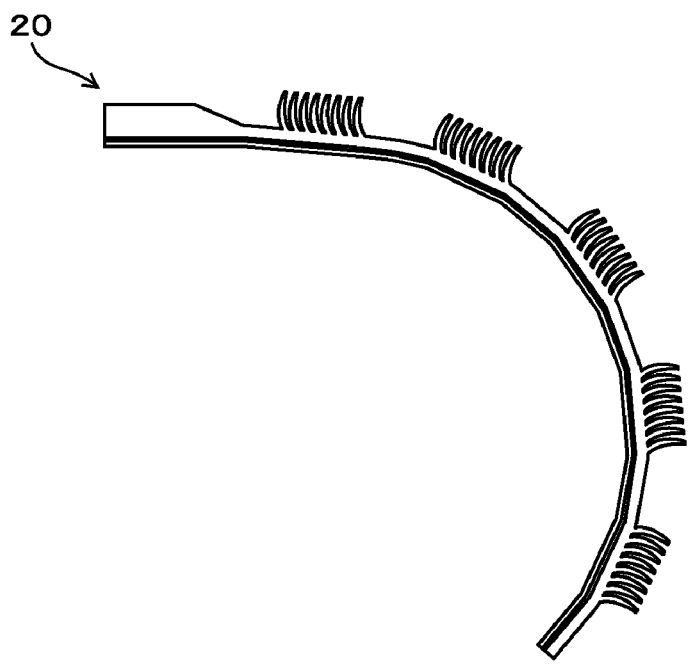
FIG. 7B is a side view showing the board shown in FIG. 7A in a bent state.

FIG. 7A shows a modification of the metal-based print board formed with radiators having a concave portion shown in FIG. 6. A plurality of concave portions 22 (i.e., the third metal plate portion) and radiators 23 (i.e., the first metal plate portion) are alternately provided on a reverse surface 21b of a metal plate 21 of a metal-based print board 20. The width of the concave portions 22 and the radiators 23 is set to be equal to that of the metal plate 21, and the thickness as a whole is therefore less than that of an end portion 21b (i.e., the second metal plate portion) which retains the original thickness of the metal plate 21. Forming the concave portions 22 to an appropriate thickness enables the metal-based print board 20 to be moderately bent or curved, as shown in FIG. 7B. The metal-based print board 20 can be thereby positioned along a curved electronic device casing or a similar surface.

The method for forming each of the concave portions 22 and the radiators 23 on the metal-based print board 20 shown in FIG. 7A is similar to that shown in FIGS. 8A through 8F described previously, and a detailed description will be omitted. However, an end portion 21c in the upper part of the drawing remains as a machined surface portion. In an instance where the machined surface portion is not required, it may be cut off using desired means at a cutting line CL indicated by the long-dashed double-short-dashed line. As with an aforementioned example, a copper foil or another metallic foil 24 is affixed in advance on a front surface 21a of the metal plate 21 with an insulating adhesive layer 25 interposed therebetween.

Other Embodiments

While the present invention was specifically described above with reference to embodiments, the invention is not limited to the described embodiments. For example, the metal-based print board may also be formed so as to have an appropriate shape other than a rectangle, as with print boards in general. Also, while the radiating fins of the radiators are all formed in parallel to each other according to the above-described embodiments, the direction of the radiating fins may be varied between each radiator by an appropriate angle. Also, since the metal-based print board has a metal plate as a base material, another mechanism component or the like may be mounted, optionally with a support section or a similar component for mounting the mechanism component.

(Method for Manufacturing Metal-Based Print Board Formed with Radiators, and Operational Advantage)

As described above, according to a method for manufacturing the metal-based print board formed with radiators according to the present invention:

a surface on one side of a metal plate having good thermal conductivity and having a metallic foil affixed to a surface on another side with an insulating adhesive layer interposed therebetween, and an excavating tool having a blade section formed on a distal end side in the direction of movement, are moved relative to each other in a state where the surface and the excavating tool have a prescribed angle therebetween, and the blade section of the excavating tool is used to dig the metal plate from the surface on one side to the surface on the other side, thereby integrally forming a tabular radiating fin upright; while the metal plate and the excavating tool are moved relative to each other from a position upstream of a machined surface formed by the formation of the radiating fins, the upstream distance corresponding to the fin formation pitch, and using the excavating tool to excavate the metal plate, thereby integrally forming the subsequent tabular radiating fin upright;

subsequently, the excavating step for integrally forming the radiating fins upright is repeated, a plurality of the radiating fins are formed, and a radiator is formed on the surface on the one side of the metal plate; and when the radiating fins integrally connected to the surface on the one side of the metal plate are formed upright, each of the radiating fins is formed so that the thickness gradually decreases from a proximal portion towards a distal end portion, the fin curves from the proximal portion towards the distal end portion, and the spacing between each of the radiating fins gradually increases from the proximal portion towards the distal end portion.

When a radiator is provided in a center portion set at a distance from an end portion of the metal plate, the excavating tool is inserted so as to be introduced at a prescribed position set at a distance from one end side of the metal plate in a state where the surface and the excavating tool have a prescribed angle therebetween; a small fin whose base portion is connected to the metal plate is initially formed; and, subsequently, a plurality of small fins are successively formed while the excavating tool is successively moved upstream by a prescribed interval until the blade section of the excavating tool reaches a prescribed depth. Here, the small fins are formed so that their respective size gradually increases. Next, when the blade section of the excavating tool reaches the prescribed depth, a fin-forming step is repeatedly performed. In the fin-forming step, the metal plate and the excavating tool are moved relative to each other from a position upstream of a machined surface formed as a result of the formation of the small fins, the upstream distance corresponding to the fin formation pitch, and a tabular radiating fin is integrally formed upright. A plurality of radiating fins are thereby formed in succession.

When a concave portion is formed between the radiators, the metal plate portion in the concave portion being thinner than the original thickness of the metal plate, the fin-forming step and the cutting step are repeated, and a concave portion having a prescribed depth is formed on the surface on the one side of the metal plate. In the fin-forming step, the surface on the one side of the metal plate is caused to move in a relative manner with respect to the excavating tool having the blade section formed on the distal end side in the direction of movement in a state where the surface and the excavating tool have a prescribed angle therebetween, the blade section of the excavating tool is used to dig the metal plate from the surface on the one side to the surface on the other side, and a tabular radiating fin is integrally formed upright. In the cutting step, the excavating tool is moved in a horizontal direction and a base end of the radiating fin is cut.

When, during the fin-forming step, the excavating tool is used to dig the surface on the one side of the metal plate and form the radiating fin upright, it is preferred that both sides of at least the base end side of the radiating fin be made to bulge, and the scrap made by cutting in the cutting step be sandwiched and held between inner walls of the concave portion.

According to the aforementioned method for manufacturing the metal-based print board, an excavating tool is used to integrally form continual tabular radiating fins on a surface on one side of a metal plate having good thermal conductivity and having a metallic foil affixed to a surface on another side with an insulating adhesive layer interposed therebetween, whereby the radiators can be formed with ease. The radiator, comprising a plurality of radiating fins, is directly formed on the metal plate of the print board, resulting in radiating means having a simple configuration and a small number of components, making it possible to reduce cost. Also, since the metal plate is dug using an excavating tool so that the radiating fins are formed, the plate thickness of a bottom surface between adjacent radiating fins can be made smaller than that of the metal plate, making it possible to manufacture a metal-based print board that can rapidly transmit heat.

When a concave portion is formed between the radiators, a bottom surface of the concave surface being thinner than the original thickness of the metal plate, the excavating tool is moved in a horizontal direction parallel to the metal plate after being used to form the tabular radiating fin upright, and the radiating fin can be cut with ease. The fin-forming step and the cutting step are repeated in succession, making it possible to form a concave portion of a desired length. During the cutting step, the radiating fin is formed so as to have a small thickness, and minimal stress is therefore applied to the metal plate; therefore, it becomes possible to form the concave portion without causing the metal plate to deform. Also, since a single excavating tool is used, it need not be exchanged or otherwise modified, and the concave portion can be formed in a short length of time.

When the excavating tool is used to dig the surface on the one side of the metal plate and to form the radiating fin upright, both sides of at least the base end side of the radiating fin are made to bulge, and scrap made by cutting in the cutting step is thereby sandwiched and held between the inner walls of the concave portion. The thin radiating fin that has turned into the scrap is therefore prevented in advance from scattering. Therefore, it becomes possible to prevent accidents where cutting oil or a similar material causes the scrap to adhere to the excavating tool and damage the blade section. Also, the scraps are concentrated in the concave portion, making it possible to facilitate removal.

The preceding description has been presented only to illustrate and describe exemplary embodiments of the present metal-based print board formed with radiators. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope.

The content of Japanese Patent Application Serial No. 2007-219101 is incorporated herein by reference in its entirety.

What is claimed is:

1. A metal-based print board formed with radiators, comprising:
    a thermally conductive metal plate having a prescribed plate thickness;
    a metallic foil affixed to a first surface of the metal plate with an adhesive layer interposed therebetween; and
    a radiator integrally formed on a second surface of the metal plate that is on an opposite side of the first surface, wherein
    the radiator has a plurality of tabular radiating fins, formed upright on the second surface of the metal plate at prescribed intervals by using an excavating tool to dig into the second surface;
    each of the radiating fins gradually decreases in thickness from a base end portion connected to the second surface towards a distal end, and curves from the base end portion to the distal end;
    a spacing between adjacent radiating fins gradually increases from the base end portion towards the distal end; and
    the metal plate is configured so that a thickness is smaller in a first metal plate portion between each of the radiating fins of the radiator than in a second metal plate portion of the metal plate excluding the radiator.

2. The metal-based print board with radiators according to claim 1, wherein the radiator is surrounded by the second metal plate portion.

3. The metal-based print board formed with radiators according to claim 1, which has at least a first radiator and a second radiator, wherein each of the first radiator and the second radiator is surrounded by the second metal plate portion.

4. The metal-based print board formed with radiators according to claim 1, which has at least a first radiator and a second radiator, wherein a third metal plate portion that is thinner than the second metal plate portion is formed between the first radiator and the second radiator.

5. The metal-based print board formed with radiators according to claim 4, wherein the third metal plate portion is formed from one end to the other end of the metal plate, and the third metal plate portion is of a thickness allowing bending or curving.

6. The metal-based print board formed with radiators according to claim 1, wherein the radiator is formed from one end to the other end of the metal plate in the widthwise direction of the radiating fin, and the first metal plate portion of the radiator is of a thickness allowing bending or curving.

7. The metal-based print board formed with radiators according to claim 1 or 2, wherein a mounting position relating to a heat-generating electronic component whose heat is to be released is defined on a surface of the metallic foil; and the radiator is formed on a portion on the second surface facing the mounting position.

8. The metal-based print board formed with radiators according to any of claim 3, 4, or 5, wherein at least a first mounting position and a second mounting position relating to a heat-generating electronic component whose heat is to be released are defined on a surface of the metallic foil; and each of the first radiator and the second radiator is formed on portions on the second surface facing the first mounting position and second mounting position, respectively.

* * * * *